(12) United States Patent
Wakayama

(10) Patent No.: US 7,015,118 B2
(45) Date of Patent: Mar. 21, 2006

(54) METHOD FOR FORMING A SCRIBE LINE ON A SEMICONDUCTOR DEVICE AND AN APPARATUS FOR FORMING THE SCRIBE LINE

(75) Inventor: Haruo Wakayama, Osaka (JP)

(73) Assignee: Mitsuboshi Diamond Industrial Co., Ltd., Suita (JP)

( * ) Notice: Subject to any disclaimer, the term of this patent is extended or adjusted under 35 U.S.C. 154(b) by 99 days.

(21) Appl. No.: 10/483,353

(22) PCT Filed: Oct. 28, 2002

(86) PCT No.: PCT/JP02/11177

§ 371 (c)(1),
(2), (4) Date: Jun. 9, 2004

(87) PCT Pub. No.: WO03/038880

PCT Pub. Date: May 8, 2003

(65) Prior Publication Data

US 2004/0214408 A1    Oct. 28, 2004

(30) Foreign Application Priority Data

Oct. 31, 2001    (JP) .............................. 2001-335149

(51) Int. Cl.
*H01L 21/78*    (2006.01)
(52) U.S. Cl. .................. 438/460; 438/462; 438/114; 438/458; 438/113; 257/620
(58) Field of Classification Search .................... None
See application file for complete search history.

(56) References Cited

U.S. PATENT DOCUMENTS

| | | | | |
|---|---|---|---|---|
| 5,157,001 A | * | 10/1992 | Sakuma ...................... 438/465 |
| 5,300,816 A | * | 4/1994 | Lee et al. .................... 257/797 |
| 5,943,591 A | * | 8/1999 | Vokoun et al. ............. 438/462 |
| 6,075,280 A | * | 6/2000 | Yung et al. ................. 257/620 |
| 6,420,245 B1 | * | 7/2002 | Manor ........................ 438/460 |

FOREIGN PATENT DOCUMENTS

| | | |
|---|---|---|
| JP | 2002-192367 | 7/2002 |
| JP | 2002-192369 | 7/2002 |
| JP | 2002-362933 | 12/2002 |
| WO | 02/22301 | 3/2002 |

* cited by examiner

*Primary Examiner*—Luan Thai
(74) *Attorney, Agent, or Firm*—Renner, Otto, Boisselle & Sklar, LLP

(57) ABSTRACT

A silicon wafer 50 including a plurality of semiconductor devices patterned on a top surface thereof as a result of a wafer production process is prepared. A transparent film is applied on the top surface of the semiconductor wafer 50 so as to cover all the plurality of semiconductor devices. The semiconductor wafer with the transparent film is placed on a rotatable table 26 such that a rear surface of the semiconductor wafer not covered with the transparent film is facing up away from the rotatable table 26. The rear surface of the semiconductor wafer 50 is heated with a laser beam to form a laser spot, along a scribe line formation line for dividing the semiconductor wafer into a plurality of semiconductor chips, to a temperature lower than a softening point of the semiconductor wafer, while an area close to the laser spot is continuously cooled along the scribe line formation line.

4 Claims, 5 Drawing Sheets

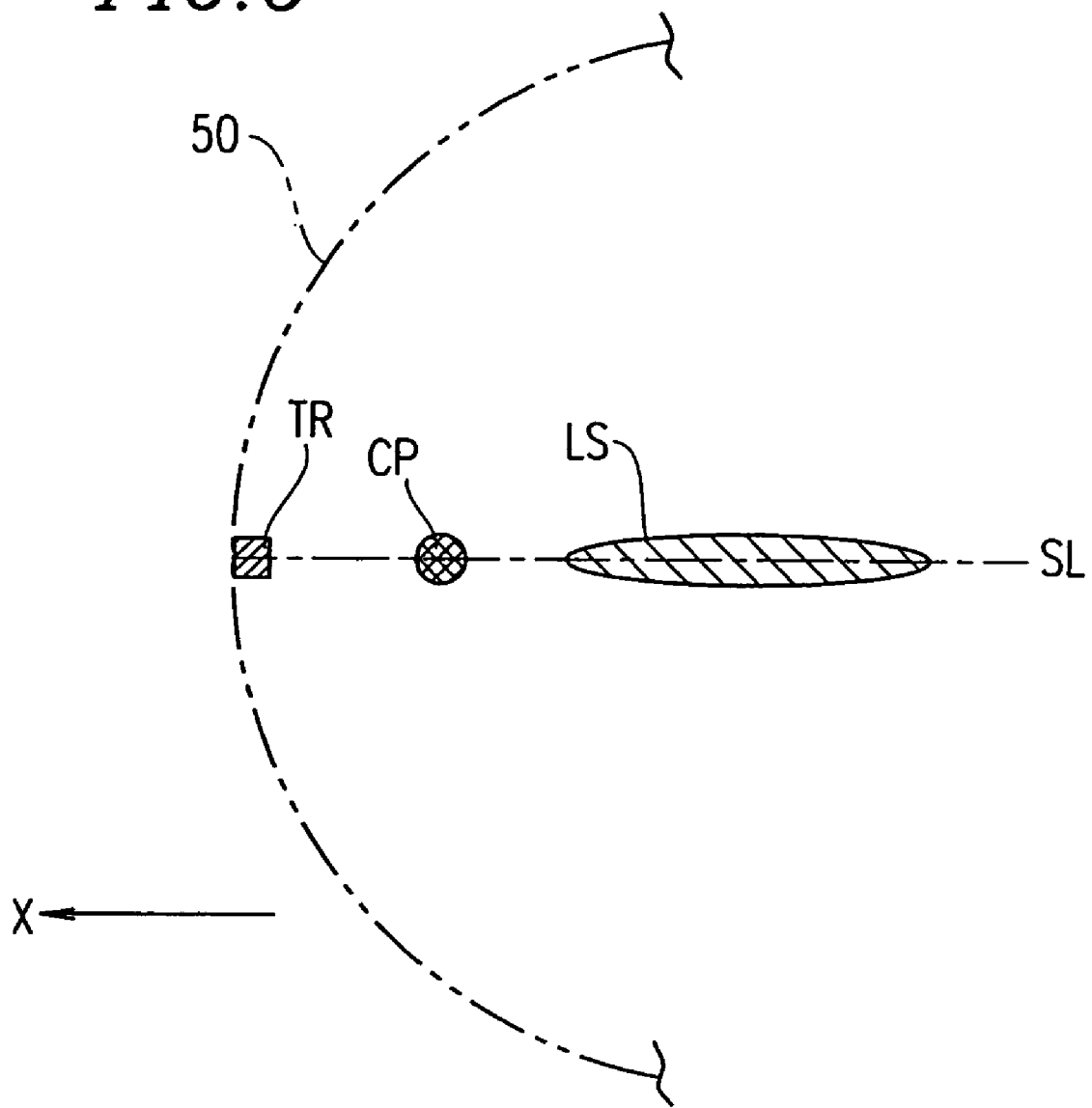

METHOD FOR FORMING A SCRIBE LINE ON A SEMICONDUCTOR DEVICE AND AN APPARATUS FOR FORMING THE SCRIBE LINE

TECHNICAL FIELD

The present invention relates to a method for forming a scribe line for dividing a semiconductor wafer such as a silicon wafer, having various semiconductor devices patterned thereon, into semiconductor chips of a prescribed size; and an apparatus for forming a scribe line usable for the method for forming a scribe line.

BACKGROUND ART

A silicon wafer having various semiconductor devices patterned on a surface thereof is divided into semiconductor chips of a prescribed size along border lines between adjacent patterns. As a method for dividing a silicon wafer into semiconductor chips, dicing, scribing, and other methods are known.

According to scribing, scribe lines are formed on a surface of a silicon wafer along borders between adjacent semiconductor patterns that are to be semiconductor chips, in consideration of the crystalline orientation of the silicon wafer. After scribing, the silicon wafer is divided into a plurality of semiconductor chips. The scribe lines are formed by pressure-contacting a diamond piece or the like to the surface of the silicon wafer. Therefore, scribing has the risk of generating cracking or chipping at many positions of the silicon wafer while the scribe line is formed on the surface thereof, depending on the scribe conditions.

In order to avoid this, dicing is usually widely used for dividing a silicon wafer. According to dicing, a blade having grinding diamond granules buried therein is rotated at a high speed so as to cut a silicon wafer along borders between adjacent patterns that are to be semiconductor chips.

However, dicing also involves the risk of generating chipping around the lines along which the silicon wafer has been cut, since the silicon wafer is mechanically cut. When chipping occurs, small broken pieces of the wafer generated by the chipping may undesirably enter the semiconductor chips as foreign objects. The semiconductor chips having such foreign objects may not provide prescribed functions.

For producing a flat display device of, for example, a liquid crystal display apparatus, the following method for forming a scribe line on a glass substrate has been developed in order to divide the glass substrate. According to this method, the glass substrate is continuously irradiated with a laser beam along lines along which the glass substrate is to be divided, while areas of the glass substrate irradiated with the laser beam are continuously cooled. It has been considered to form a scribe line on a silicon wafer using such a method which combines heating with a laser beam and cooling. However, such a method has not been put into practice for the reason that when a surface of a silicon wafer is continuously irradiated with a laser beam while being cooled, the electric functions of the semiconductor devices on the surface of the silicon wafer may be spoiled.

The present invention, for solving such problems, has an object of providing a method for forming a scribe line on a semiconductor wafer, such as a silicon wafer or the like, for dividing the semiconductor wafer without fail and without generating chipping, cracking or the like in the semiconductor wafer; and an apparatus for forming a scribe line usable for the method.

DISCLOSURE OF THE INVENTION

A method for forming a scribe line on a semiconductor wafer according to the present invention includes the steps of preparing a semiconductor wafer including a plurality of semiconductor devices patterned on a surface thereof as a result of a wafer production process; applying a transparent film to the surface of the semiconductor wafer so as to cover all the plurality of semiconductor devices; placing the semiconductor wafer with the transparent film on a prescribed table such that a rear surface of the semiconductor wafer is facing up away from the prescribed table; and continuously heating the rear surface of the semiconductor wafer on the prescribed table with a laser beam to form a laser spot, along a predetermined line for forming a scribe line (hereinafter, referred to as a scribe line formation line) for dividing the semiconductor wafer into a plurality of semiconductor chips, to a temperature lower than a softening point of the semiconductor wafer, while continuously cooling an area closer to the laser spot along the scribe line formation line.

In one embodiment of the invention, the surface of the silicon wafer has an alignment mark at a prescribed position, and the alignment mark is used for positioning the table having the semiconductor wafer being secured thereto.

In one embodiment of the invention, the table having the semiconductor wafer being secured thereto is positioned based on an image of the alignment mark imaged through the transparent film.

An apparatus for forming a scribe line on a semiconductor wafer according to the present invention includes a table on which a semiconductor wafer is to be placed such that a rear surface of the semiconductor wafer is facing up away from the table, wherein the semiconductor wafer includes a plurality of semiconductor devices patterned on a surface thereof as a result of a wafer production process, has an alignment mark on the surface thereof, and has the surface covered with a transparent film; a means for continuously forming a laser spot on the rear surface of the semiconductor wafer along a scribe line formation line; and a means for continuously cooling an area close to an area, which is heated by a laser beam to a temperature lower than a softening point of the semiconductor wafer placed on the table, along the scribe line formation line. The table includes an imaging mechanism for imaging the alignment mark on the semiconductor wafer placed on the table through the transparent film.

BRIEF DESCRIPTION OF THE DRAWINGS

FIG. 6 is a view illustrating an operation of the apparatus for forming a scribe line.

BEST MODE FOR CARRYING OUT THE INVENTION

Hereinafter, examples of the present invention will be described in detail. In the following examples, a silicon wafer is used as a semiconductor wafer, but the present invention is applicable to other semiconductor wafers in substantially the same manner. Semiconductor chips are produced on a silicon wafer as follows. First, various types of semiconductor devices are patterned in semiconductor chip areas on a surface of the silicon wafer (wafer production process). Then, the surface of the silicon wafer including the patterned semiconductor devices is washed in order to remove naturally occurring oxide layers, contamination and the like. Thereafter, a scribe line is formed on the silicon wafer, along which the silicon wafer is to be divided into semiconductor chips, using the method for forming a scribe line of the present invention. Then, the silicon wafer is divided along the scribe line, and thus a plurality of semiconductor chips are produced.

Figure 1:
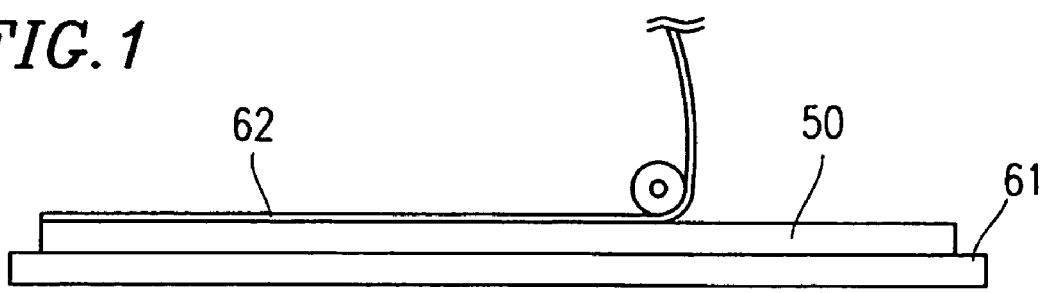
FIG. 1 is a schematic side view for illustrating a process of a method for forming a scribe line according to the present invention.

An example of the method for forming a scribe line of the present invention will be described. As shown in FIG. 1, semiconductor devices are patterned on a surface of a silicon substrate as a result of the wafer production process and the surface of the silicon wafer with the patterned semiconductor devices is washed. Thus, a silicon wafer 50 is prepared. On the surface of the silicon wafer 50, a pair of alignment marks are provided. The silicon wafer 50 is placed on a prescribed operation table 61 such that a surface of the silicon wafer 50 with the patterned semiconductor devices is facing up.

Figure 2:
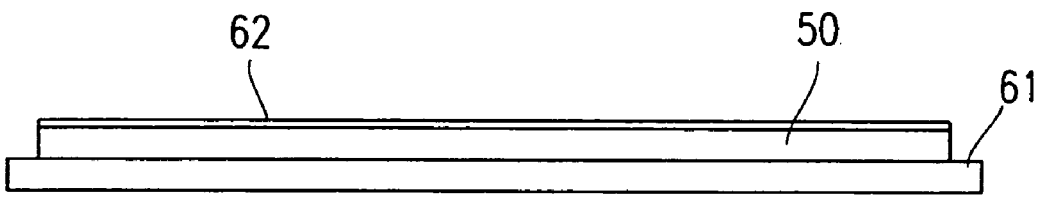
FIG. 2 is a side view of a silicon wafer obtained by the process.

When the silicon wafer 50 is placed on the operation table 61, a transparent film 62 is applied to the surface of the silicon wafer 50 with the patterned semiconductor devices. Thus, as shown in FIG. 2, the entire surface of the silicon wafer 50 is covered with the transparent film 62. In this state, the surface of the silicon wafer 50 with the patterned semiconductor devices is protected by the transparent film 62.

Then, the silicon wafer 50 is transported to and placed on a table of a scribe line formation apparatus according to the present invention and is held on a surface of the table.

Figure 3:
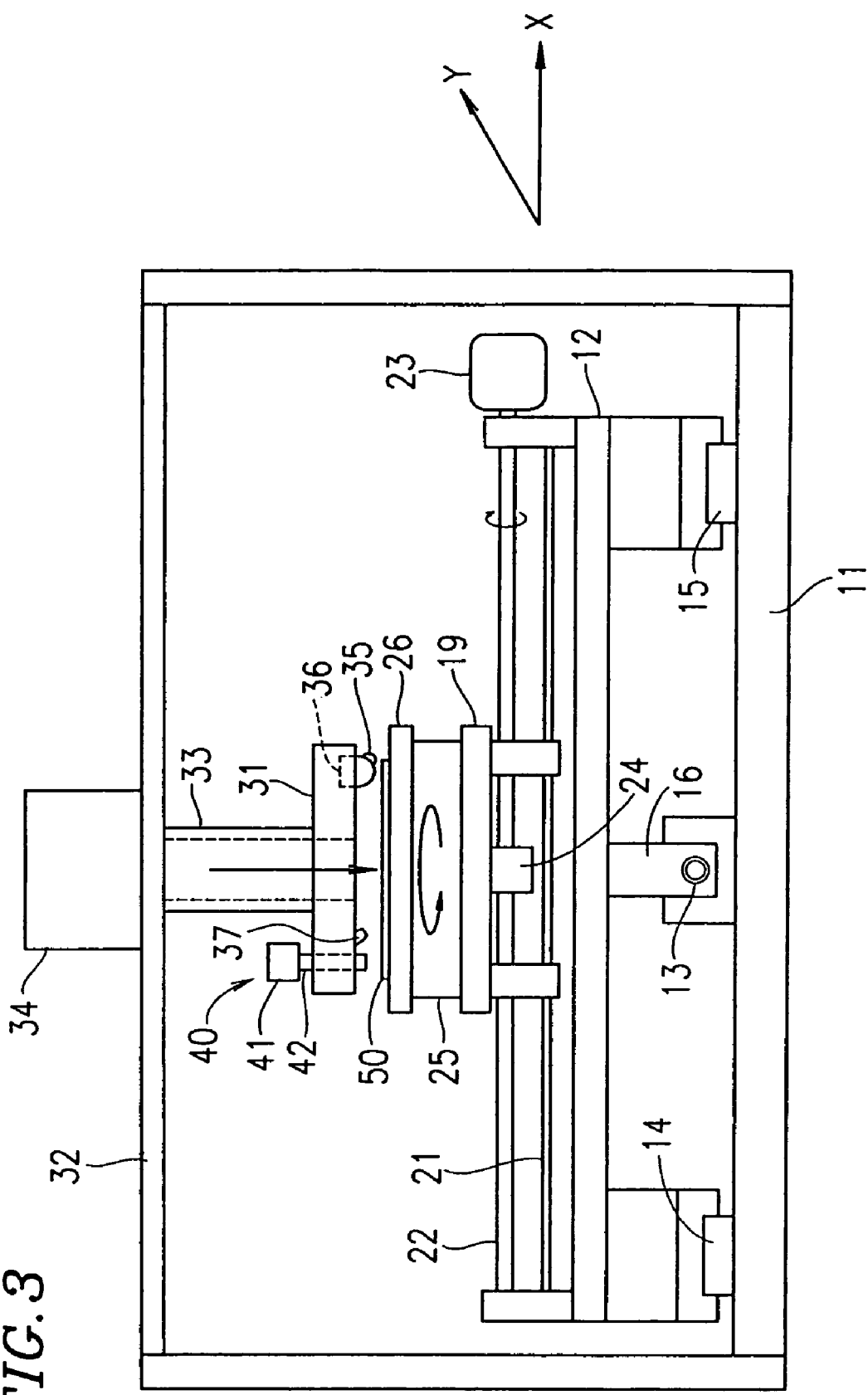
FIG. 3 is a schematic front view of an example of an apparatus for forming a scribe line according to the present invention.

FIG. 3 is a schematic structural view of an example of the scribe line formation apparatus according to the present invention. As shown in FIG. 3, the scribe line formation apparatus includes a slidable table 12 on a horizontal base 11. The slidable table 12 is reciprocally movable in a prescribed horizontal direction (Y direction).

The slidable table 12 is supported by a pair of guide rails 14 and 15 so as to be horizontally slidable along the guide rails 14 and 15. The guide rails 14 and 15 are provided on an upper surface of the base 11 and extend in the Y direction, parallel to each other. At a central position between the guide rails 14 and 15, a ball screw 13 parallel to the guide rails 14 and 15 is provided so as to be rotated by a motor (not shown). The ball screw 13 is rotatable both forward and backward. A ball nut 16 is engaged with the ball screw 13. The ball nut 16 is integrally provided to the slidable table 12 so as not to rotate. When the ball screw 13 rotates forward and backward, the ball nut 16 is moved along the ball screw 13 in both directions along the Y direction. Thus, the slidable table 12 integral with the ball nut 16 slides in both directions along the guide rails 14 and 15 in the Y direction.

A pedestal 19 is horizontally provided on the slidable table 12. The pedestal 19 is slidably supported by a pair of guide rails 21, which are provided above the slidable table 12. The pair of guide rails 21 extend in an X direction perpendicular to the Y direction, and are parallel to each other. At a central position between the guide rails 21, a ball screw 22 parallel to the guide rails 21 is provided. The ball screw 22 is rotatable forward and backward by a motor 23.

A ball nut 24 is engaged with the ball screw 22. The ball nut 24 is integrally provided to the pedestal 19 so as not to rotate. When the ball screw 22 rotates forward and backward, the ball nut 24 is moved along the ball screw 22 in both directions along the X direction. Thus, the pedestal 19 slides along the guide rails 21 in both directions along the X direction.

A rotation mechanism 25 is attached to pedestal 19. On the rotation mechanism 25, a rotatable table 26 is horizontally provided. On the rotatable table 26, the silicon wafer 50, on which a scribe line is to be formed, is to be placed. The rotation mechanism 25 is structured to rotate the rotatable table 26 about a vertical central axis of the rotation mechanism 25. The rotation mechanism 25 can rotate the rotatable table 26 to an arbitrary rotation angle θ with respect to a reference position. On the rotatable table 26, the silicon wafer 50 is placed such that the surface of the silicon wafer 50 covered with the transparent film 62 is in contact with an upper surface of the rotatable table 26. The silicon wafer 50 is secured on the rotatable table 26 by, for example, a suction chuck, and then the rotatable table 26 is positioned. In other words, on the rotatable table 26, a rear surface of the silicon wafer 50 with no semiconductor devices patterned thereon is facing up away from the rotatable table 26.

Figure 4:
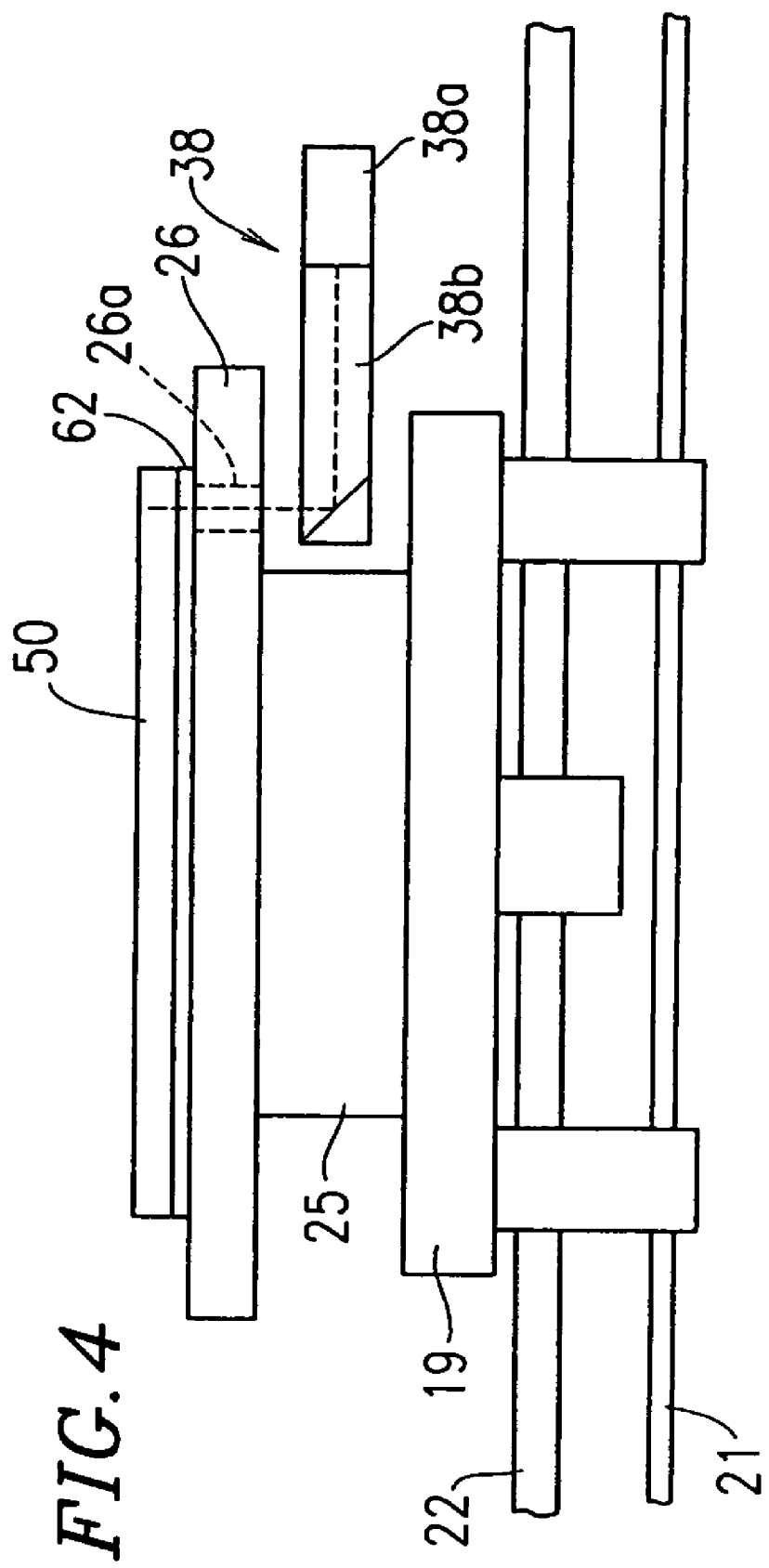
FIG. 4 is an enlarged schematic view of the apparatus for forming a scribe line.
Figure 5:
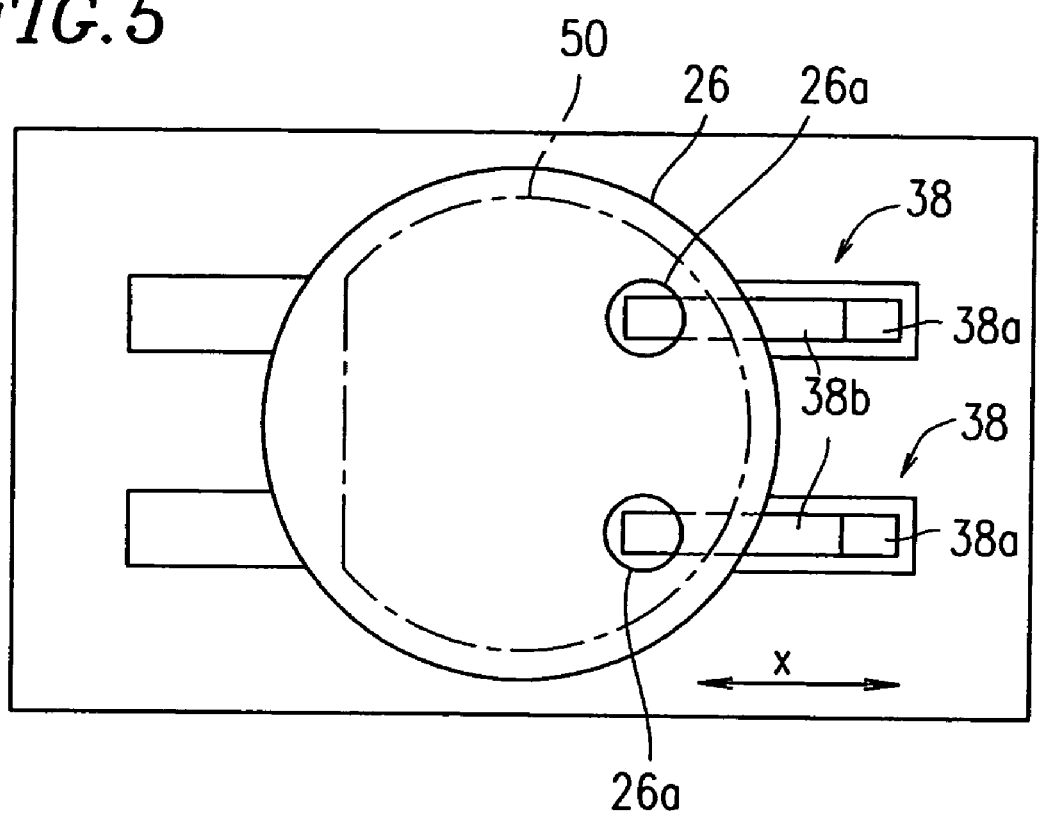
FIG. 5 is a schematic plan view of a rotatable table of the apparatus for forming a scribe line.

FIG. 4 is an enlarged schematic view of the rotatable table 26 and the vicinity thereof, and FIG. 5 is a schematic plan view of the rotatable table 26 and the vicinity thereof. The surface of the silicon wafer 50 facing down on the disc-shaped rotatable table 26 has a pair of alignment marks, and the rotatable table 26 has a pair of circular through-holes 26a. The circular through-holes 26a are provided in correspondence with the alignment marks. Below the rotatable table 26, imaging mechanisms 38 are provided integrally with the rotatable table 26. The imaging mechanisms 38 are provided such that an axial center of each of the through-holes 26a substantially matches an optical axis of the respective imaging mechanism 38.

The imaging mechanisms 38 each include a CCD camera 38a, and an optical system 38b for imaging, through the respective through-hole 26a, the corresponding alignment mark of the silicon wafer 50 on the rotatable table 26 using the CCD camera 38a. The imaging result of each imaging mechanism 38 is output to an image processing apparatus (not shown).

Above the rotatable table 26, a support table 31 is provided with an appropriate space from the rotatable table 26. The support table 31 is horizontally supported at a lower end of an optical holder 33. The optical holder 33 is vertically provided. An upper end of the optical holder 33 is attached to a lower surface of an attachment table 32, which is provided on the base 11. On the attachment table 32, a laser oscillator 34 for oscillating a laser beam is provided. An optical system held inside the optical holder 33 is irradiated with the laser beam oscillated by the laser oscillator 34.

The laser beam oscillated by the laser oscillator 34 is directed to the rear surface of the silicon wafer 50 with no semiconductor devices, and forms an elliptical laser spot, which is longer along a line between adjacent portions that are to be semiconductor chips, along which a scribe line is to be formed.

A cooling nozzle 37 is provided on the support table 31, away from the optical holder 33 at an appropriate distance in the X direction. The cooling nozzle 37 faces the silicon wafer 50 placed on the rotatable table 26. The cooling nozzle 37 is provided for spraying a coolant such as, for example, cooling water, to the rear surface of the silicon wafer 50. More specifically, the coolant is sprayed to a position, in the rear surface of the silicon wafer 50, which is an appropriate distance away from one end of the elliptical laser spot in the direction of the longer axis. As described above, the laser spot LS is formed on the rear surface of the silicon wafer 50 by the laser beam directed from the optical holder 33. The coolant sprayed from the cooling nozzle 37 may be, for example, a mixed fluid of water and compressed air, cooling water, compressed air, He gas, $N_2$ gas, or $CO_2$ gas.

The support table 31 is provided with an imaging mechanism 40 close to the cooling nozzle 37. The imaging mechanism 40 is provided for imaging the rear surface of the silicon wafer 50. The imaging mechanism 40 includes a CCD (imaging element) 41 facing a prescribed area close to a position of the rear surface of the silicon wafer 50 sprayed with the coolant by the cooling nozzle 37. The CCD 41 faces the prescribed area, with an optical system 42 provided therebetween. The CCD (imaging element) 41 detects whether or not the scribe line has been formed without fail. The CCD 41 can take an image of an area in the rear surface of the silicon wafer 50, more specifically, an area which is along the longer axis of the elliptical laser spot and is close to a position at which the coolant is sprayed from the cooling nozzle 37.

The support table 31 is also provided with a wheel cutter 35 oppositely from the cooling nozzle 37 with respect to the laser spot formed on the rear surface of the silicon wafer 50 by the laser beam directed from the optical holder 33. The wheel cutter 35 is provided along the longer axis of the laser spot formed by the laser beam radiating from the optical holder 33. The wheel cutter 35 is provided for making a notch in an end area of the silicon wafer 50 on the rotatable table 26, in the direction in which the scribe line is to be formed. The wheel cutter 35 is held by a chip holder 36 so as to be movable upward and downward.

Control of various operations of the scribe line formation apparatus including positioning of the slidable table 12 and the pedestal 19, and control of the rotation mechanism 25 and laser oscillator 34, are performed by a control section (not shown).

The scribe line formation apparatus having the above-described structure for forming a scribe line on the silicon wafer 50 operates as follows. First, information data, including the size of the silicon wafer 50 and the position at which the scribe line is to be formed, is input to the control section.

Then, the silicon wafer 50 is placed on the rotatable table 26 such that the surface of the silicon wafer 50 covered with the transparent film 62 is facing down. The silicon wafer 50 is secured by the suction means and then is positioned. Since the surface of the silicon wafer 50 with the semiconductor devices formed thereon is covered with the transparent film 62, the semiconductor devices and the like are not damaged or broken by the rotatable table 26.

The silicon wafer 50 is suctioned to be secured and positioned with respect to the rotatable table 26, such that the pair of alignment marks on the surface thereof respectively correspond to the through-holes 26a formed in the rotatable table 26.

For positioning the silicon wafer 50 secured on the rotatable table 26, the alignment marks on the surface of the silicon wafer 50 are imaged by the CCD cameras 38a of the imaging mechanisms 38. An offset between the imaging center of each of the CCD camera 38a and the center of the corresponding alignment mark is calculated by the image processing apparatus (not shown), and the calculation result is sent to the control section.

The control section positions the rotatable table 26 based on the calculation result of the offset obtained by the image processing apparatus, such that the longer axis of the laser spot matches the scribe line formation line on the silicon wafer 50. When the scribe line formation line in an end area of the silicon wafer 50 faces the wheel cutter 35, the wheel cutter 35 is lowered and makes a notch in the end area of the scribe line formation line.

The rotatable table 26 is slid in the X direction along the scribe line formation line. During the movement, the laser oscillator 34 oscillates a laser beam, and the cooling nozzle 37 sprays cooling water with compressed air.

As shown in FIG. 6, the laser beam from the laser oscillator 34 forms an elliptical laser spot LS, which is longer along the scribe line formation line SL, on the rear surface of the silicon wafer 50. The coolant is sprayed toward a position which is on the scribe line formation line SL and an appropriate distance away from, and behind, the laser spot LS. Thus, a cooled spot CP is formed.

The rear surface of the silicon wafer 50 on which the laser spot LS is formed is heated to a temperature which is lower than the temperature at which the silicon wafer 50 is melted, i.e., a temperature lower than the softening point of the silicon wafer 50. Therefore, the rear surface of the silicon wafer 50 on which the laser spot LS is formed is heated without being melted, and a compressive stress is generated at the heated spot.

The cooled spot CP is formed in the vicinity of the laser spot LS on the rear surface of the silicon wafer 50 by the coolant such as cooling water or the like being sprayed by the cooling nozzle 37. The rear surface of the silicon wafer 50 is cooled by the cooled spot CP, and a tensile stress is generated at the cooled spot CP.

The tensile stress is generated at a position close to an area where the compressive stress is generated on the rear surface of the silicon wafer 50. Therefore, a stress gradient is generated between the laser spot LS and the cooled spot CP based on the respective stresses. As a result, a "vertical crack for necessary division" necessary for dividing the silicon wafer 50 is formed in the thickness direction of the silicon wafer 50 from the notch TR, which is formed in the end area of the rear surface of the silicon wafer 50, along the scribe line formation line SL.

In this manner, the vertical crack for necessary division, which is usually invisible with the naked eye, is formed along the scribe line formation line SL on the rear surface of the silicon wafer 50 in the thickness direction. Since the vertical crack for necessary division is generated by the compressive stress and the tensile stress, there is no risk of generating chipping, cracking or the like in the silicon wafer 50 along the scribe line formation line SL during the generation of the vertical crack for necessary division.

Thereafter, vertical crack lines (scribe lines), necessary for dividing the silicon wafer 50 into semiconductor chips, are continuously formed in the same manner in the rear surface of the silicon wafer 50 along the scribe line formation line SL. When the vertical crack lines (scribe lines) for necessary division are formed along the scribe line formation lines in the entire rear surface of the silicon wafer 50, the silicon wafer 50 is supplied to the next stage, i.e., a dividing stage with the transparent film 62 still being applied. In the dividing stage, the silicon wafer 50 is divided along the vertical crack lines (scribe lines).

When the silicon wafer 50 is divided along all the vertical crack lines (scribe lines), a plurality of semiconductor chips are obtained on the transparent film 62.

In the above example, the silicon wafer 50 is suctioned so as to be secured on the rotatable table 26. Alternatively, the silicon wafer 50 may be secured on the rotatable table 26 by mechanically holding the circumferential surface of the silicon wafer 50.

In the above example, after the notch TR is formed in the end area of the silicon wafer 50, the laser spot LS and the cooled spot CP are moved toward the inside of the rear surface of the silicon wafer 50 along the scribe line formation line SL extending from the notch TR, thus forming a vertical crack line (scribe line) for necessary division. Alternatively, the notch can be formed in the end area of the silicon wafer 50 between the time immediately after the laser spot passes the end area of the silicon wafer 50 and the time immediately before the cooled spot passes the end area of the silicon wafer 50 by a notch making means, instead of being formed before moving the laser spot LS and the cooled spot CP. In the alternative manner also, the vertical crack for necessary division can be formed at the same depth. In this manner, unintended and unnecessary cracks can be prevented from being uncontrollably generated in the end area of the wafer.

As the notch making means, a diamond tool or a superhard alloy tool used for scribing a brittle material, or a pulsed laser such as YAG laser or the like can be used. The notch can be made at any position on the rear surface of the silicon wafer as well as in the end area.

After the cooled spot is formed, a second laser spot may be formed on the rear surface of the silicon wafer. In this manner, the vertical crack for necessary division which has already been formed can reach the surface of the silicon wafer covered with the transparent film. This simplifies the operation of the dividing stage.

INDUSTRIAL APPLICABILITY

According to a method for forming a scribe line on a semiconductor wafer of the present invention, while a surface of the semiconductor wafer with patterned semiconductor devices is covered with a transparent film, the opposite, rear surface of the semiconductor wafer is heated by a laser beam and cooled using a cooling nozzle. Thus, the vertical crack line (scribe line) necessary for dividing the semiconductor wafer is formed. Therefore, the surface of the semiconductor wafer having the semiconductor devices thereon is not damaged.

Since the scribe line is formed using a thermal stress, unnecessary cracks are not formed. Therefore, when the semiconductor wafer is divided, a fewer broken pieces are generated as compared to the conventional art.

An apparatus for forming a scribe line usable according to the present invention can perform such a method for forming a scribe line without fail.

The invention claimed is:

1. A method for forming a scribe line on a semiconductor wafer, comprising the steps of:

preparing a semiconductor wafer including a plurality of semiconductor devices patterned on a surface thereof as a result of a wafer production process;

applying a transparent film to the surface of the semiconductor wafer so as to cover all the plurality of semiconductor devices;

placing the semiconductor wafer with the transparent film on a prescribed table such that a rear surface of the semiconductor wafer is facing up away from the prescribed table; and continuously heating the rear surface of the semiconductor wafer on the prescribed table with a laser beam to form a laser spot, along a scribe line formation line for dividing the semiconductor wafer into a plurality of semiconductor chips, to a temperature lower than a softening point of the semiconductor wafer, while continuously cooling an area closer to the laser spot along the scribe line formation line.

2. A method for forming a scribe line on a semiconductor wafer according to claim 1, wherein the surface of the silicon wafer has an alignment mark at a prescribed position, and the alignment mark is used for positioning the table having the semiconductor wafer being secured thereto.

3. A method for forming a scribe line on a semiconductor wafer according to claim 2, wherein the table having the semiconductor wafer being secured thereto is positioned based on an image of the alignment mark imaged through the transparent film.

4. An apparatus for forming a scribe line on a semiconductor wafer, comprising:

a table on which a semiconductor wafer is to be placed such that a rear surface of the semiconductor wafer is facing up away from the table, wherein the semiconductor wafer includes a plurality of semiconductor devices patterned on a surface thereof as a result of a wafer production process, has an alignment mark on the surface thereof, and has the surface covered with a transparent film;

a means for continuously forming a laser spot on the rear surface of the semiconductor wafer along a scribe line formation line; and a means for continuously cooling an area close to an area, which is heated by a laser beam to a temperature lower than a softening point of the semiconductor wafer placed on the table, along the scribe line formation line, wherein the table includes an imaging mechanism for imaging the alignment mark on the semiconductor wafer placed on the table through the transparent film.

* * * * *